United States Patent
McMillan et al.

(10) Patent No.: US 6,404,003 B1
(45) Date of Patent: Jun. 11, 2002

(54) THIN FILM CAPACITORS ON SILICON GERMANIUM SUBSTRATE

(75) Inventors: Larry D. McMillan; Carlos A. Paz de Araujo; Koji Arita, all of Colorado Springs, CO (US); Masamichi Azuma, Shiga (JP)

(73) Assignees: Symetrix Corporation, Colorado Springs, CO (US); Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/362,480

(22) Filed: Jul. 28, 1999

(51) Int. Cl.$^7$ .................. H01L 27/108; H01L 29/00
(52) U.S. Cl. ............... 257/306; 257/310; 257/311; 257/532; 257/535
(58) Field of Search ................. 257/301–310, 257/616, 311, 532, 535; 361/303, 305

(56) References Cited

U.S. PATENT DOCUMENTS

| | | |
|---|---|---|
| 4,771,013 A | 9/1988 | Curran |
| 5,159,424 A | 10/1992 | Morishita |
| 5,268,324 A | 12/1993 | Aitken et al. |
| 5,357,119 A | 10/1994 | Wang et al. |
| 5,424,227 A | 6/1995 | Dietrich et al. |
| 5,426,316 A | 6/1995 | Mohammad |
| 5,473,171 A | 12/1995 | Summerfelt |
| 5,504,041 A | 4/1996 | Summerfelt |
| 5,523,243 A | 6/1996 | Mohammad |
| 5,601,869 A | 2/1997 | Scott et al. |
| 5,620,739 A | 4/1997 | Azuma et al. |
| 5,691,546 A | 11/1997 | Morishita |
| 5,712,184 A | 1/1998 | Kaiser |
| 5,729,054 A | 3/1998 | Summerfelt et al. |
| 5,793,057 A | 8/1998 | Summerfelt |
| 5,811,851 A | 9/1998 | Nishioka et al. |

FOREIGN PATENT DOCUMENTS

| | | |
|---|---|---|
| EP | 0 855 738 A2 | 9/1998 |
| JP | 06333772 | 12/1994 |

OTHER PUBLICATIONS

Harame Et Al., "A High Performance Epitaxial SiGe–Base ECL BiCMOS Technology," International Electron Devices Meeting, IEEE (San Francisco, CA), pp. 1–22 (Dec. 13–16, 1992).

Cressler Et Al., "Solid State Devices—Siliscon Heterostructure and Novel Devices," International Devices Meeting, IEEE (San Francisco, CA), p. 10 (Dec. 8–10, 1996).

Kondo Et Al., "Sub–10 fJ ECL/68–uA 4.7–GHz Divider Ultra–Low–Power SiGe Base Bipolar Transistors with a Wedge–Shaped CVD–SiO2 Isolation Structure and a BPS-G–Refilled Trench," International Electron Devices Meeting, IEEE (San Francisco, CA), p. 245–248 (Dec. 8–11, 1996).

Lanzerotti Et Al., "Suppression of Boron Outdiffusion in SiGe HBTs by Carbon Incorporation," International Electron Devices Meeting, IEEE (San Francisco, CA), pp. 249–252 (Dec. 8–11, 1996).

(List continued on next page.)

*Primary Examiner*—Minh Loan Tran
(74) *Attorney, Agent, or Firm*—Patton Boggs LLP

(57) ABSTRACT

An integrated circuit capacitor containing a thin film dielectric metal oxide is formed above a silicon germanium substrate. A silicon nitride diffusion barrier layer is deposited on a silicon germanium substrate to prevent evaporation of the substrate in subsequent heating steps. A silicon dioxide stress reduction layer is deposited on the diffusion barrier layer. A bottom electrode is formed on the stress reduction layer, then a liquid precursor is spun on the bottom electrode, dried at about 400° C., and annealed at between 600° C. and 850° C. to form a BST capacitor dielectric. A top electrode is deposited on the dielectric and annealed. The integrated circuit may also include a BiCMOS device, a HBT device or a MOSFET.

26 Claims, 3 Drawing Sheets

OTHER PUBLICATIONS

Joseph Et Al., "Impact of Profile Scaling in High–Injection Barrier Effects in Advanced UHV/CVD SiGe HBTs," International Electron Devices Meeting, IEEE (San Fracisco, CA), pp. 253–256 (Dec. 8–11, 1996).

Chang Et Al., "Effect of Carbon on the Valence Band Offset of Si1–x–yGexCy/Si Heterojunctions," International Electron Devices Meeting, IEEE (San Francisco, Ca), pp. 257–260 (Dec. 8–11, 1996).

Ray Et Al., "Novel SiGeC Channel Heterojunction PMOS-FET," International Electron Devices Meeting, IEEE (San Francisco, CA), pp. 261–264 (Dec. 8–11, 1996).

Koizumi Et Al., "A GaAs MMIC Chip–Set for Mobile Communications Using On–Chip Ferroelectric Capacitors," IEEE Journal of Solid–State Circuits, IEEE, vol. 31, (No. 6), (Jul. 6, 1996).

IBM, "IBMSGRF0100 Silicon Germanium HBT (SiGe transistor in a SOT–353 package), " (1998).

THIN FILM CAPACITORS ON SILICON GERMANIUM SUBSTRATE

BACKGROUND OF THE INVENTION

1. Field of the Invention

The invention in general relates to the fabrication of integrated circuits utilizing metal oxides, such as barium strontium titanate, and more particularly to the fabrication of thin film capacitors on silicon germanium substrates.

2. Statement of the Problem

Metal oxide materials, such as barium strontium titanate, commonly referred to as BST, are known to be useful in making Integrated circuit thin film capacitors having high dielectric constants. See, for example, Kuniaki Koyama et al., "A Stacked Capacitor With $(Ba_xSr_{1-x})TiO_3$ For 256M DRAM" in IDEM (International Electron Devices Meeting) *Technical Digest*, December 1991, pp. 32.1.1–32.1.4; and U.S. Pat. No. 5,122,923 issued to Shogo Matsubara et al. In both of these references, the BST capacitors are fabricated on a silicon substrate. The results were good at low frequencies, i.e., about 10 megahertz; however, metal oxide thin film capacitors having high capacitance at high frequencies, i.e., at frequencies of 1 gigahertz and higher, are not easily fabricated using silicon substrates. Since, the typical operating frequencies of memories and other electronic devices is constantly increasing, such BST capacitors are becoming less and less useful for current state-of-the-art electronic devices.

It is also known that a DRAM memory containing a thin film of the metal oxide such as barium strontium titanate ("BST") in a memory capacitor can be fabricated on other semiconductor substrates also. See, for example, U.S. Pat. Nos. 5,793,057 issued Aug. 11, 1998 to Scott R. Summerfelt, No. 5,729,054 issued on Mar. 17, 1998 to Scott R. Summerfelt et al., No. 5,504,041 issued on Apr. 2, 1996 to Scott R. Summerfelt, and No. 5,473,171 Issued Dec. 5, 1995 to Scott R. Summerfelt. However, all these patents teach that either a complex underlying structure, exotic materials, or both are required to utilize the BST on any substrate. The complex underlying layers create three additional problems: they add to the expense of making the memory, and they add bulk to the memory making it difficult to create a small, dense memory package. The exotic materials Introduce new, untested materials into the integrated circuit fabrication process that can lead to further manufacturing problems and/or create compatibility problems over time. Further, while the references are silent as to the usefulness of such complex structures and exotic materials in obtaining good high frequency performance, it is evident that the complex structures create multiple capacitances in series that are generally believed to be detrimental to high frequency performance.

Thus, it would be highly desirable to have a high dielectric constant integrated circuit capacitor structure that was relatively simple, utilized conventional integrated circuit materials, and still performed well at high frequencies.

3. Solution to the Problem

The invention provides a structure and a fabrication method for high-capacitance, high-frequency thin film capacitors that avoid problems associated with prior art substrates.

The invention provides a high capacitance thin film capacitor device comprising a silicon germanium substrate ("SiGe substrate") and a capacitor, wherein the capacitor comprises a bottom electrode, a top electrode, and a thin film of dielectric metal oxide between the electrodes. In one embodiment of the Invention, the thin film of metal oxide comprises barium strontium titanate. The barium strontium titanate may be represented by a chemical formula $(Ba_{1-x}Sr_x)TiO_3$, where $0 \leq x \leq 1$, and preferably by the formula $(Ba_{0.7}Sr_{0.3})TiO_3$. In another embodiment, the metal oxide comprises a layered superlattice material. The layered superlattice material may be ferroelectric or nonferroelectric. In another embodiment, the metal oxide comprises a perovskite compound. The perovskite may be ferroelectric or nonferroelectric.

In this disclosure, the term "silicon germanium (SiGe) substrate" is defined as any semiconductor substrate that contains a silicon germanium region. In one embodiment, the SiGe substrate comprises a silicon germanium semiconductor wafer. In this embodiment, the SiGe region essentially comprises the entire wafer. However, in a typical embodiment, the SiGe substrate comprises a conventional semiconductor silicon wafer containing a distinct silicon germanium region. In this typical embodiment, the silicon germanium region may be germanium-doped silicon, or it may be an epitaxial silicon germanium layer. An epitaxial silicon germanium layer may be deposited on silicon using conventional methods, which include molecular beam epitaxy ("MBE"), rapid thermal chemical vapor deposition ("RTCVD"), and ultra-high vacuum chemical vapor deposition ("UHVCVD"). Typically, a silicon germanium layer on silicon is patterned and etched, or alternatively, it may be initially formed according to a pattern.

In an embodiment of the invention, the SiGe substrate comprises a silicon germanium device portion. The silicon germanium device portion includes a silicon germanium device. The silicon germanium device included in the silicon germanium device portion may be a BICMOS device. The silicon germanium device may be a heterojunction bipolar transistor ("HBT") device. The silicon germanium device may be a MOSFET. At least part of the silicon germanium region is included in the silicon germanium device portion and in the silicon germanium device.

In a typical embodiment, the invention comprises a field oxide layer located on the SiGe substrate between the SiGe substrate and the bottom electrode. The field oxide layer may comprise silicon. An embodiment of the invention may comprise a diffusion barrier layer located on the field oxide layer between the field oxide layer and the bottom electrode.

The invention provides an improvement over co-pending and co-owned U.S. patent application Ser. No. 08/438,062, which is a divisional application of U.S. patent application Ser. No. 08/214,401, now U.S. Pat. No. 5,620,739. In the most preferred embodiment, a diffusion barrier layer is formed over a SiGe substrate between the substrate and the bottom electrode. The diffusion barrier layer may comprise $Si_3N_4$. When the capacitor device contains a diffusion barrier layer, it preferably also contains a stress reduction layer located on the diffusion barrier layer between the diffusion barrier layer and the bottom electrode. The stress reduction layer may comprise silicon dioxide or a glasseous oxide.

The bottom electrode of the capacitor may comprise an adhesion layer and a second, electrode layer. The adhesion layer may be a material selected from titanium, tantalum, nickel, tantalum silicide, nickel silicide, and palladium. Preferably, the electrode comprises platinum.

The invention also provides a method of fabricating a high capacitance thin film capacitor device. The method includes steps of providing a SiGe substrate; forming a bottom electrode; providing a liquid precursor for forming a thin film of dielectric metal oxide; applying the liquid precursor to form a coating on the bottom electrode; treating the coating on the bottom electrode to form the thin film of dielectric metal oxide; and forming a top electrode on the thin film of dielectric metal oxide. Preferably, the step of applying comprises spinning the liquid precursor on the bottom electrode. The step of treating typically comprises heating the coating on the electrode to a temperature of from 200° C. to 500° C. In particular, the step of treating may comprise heating the coating on the electrode to a temperature of about 400° C. in air or nitrogen gas. The step of treating comprises annealing the coating on the electrode at a temperature of between 600° C. and 850° C. Typically, the annealing is conducted at a temperature of about 700° C. in oxygen. Typically, the step of treating comprises a first anneal of the thin film of dielectric metal oxide for a time between 1 minute and 90 minutes. Typically, the method of the invention further includes a second anneal of the thin film of dielectric metal oxide for a time between 1 minute and 90 minutes. In an embodiment of the method, the step of treating may include drying the liquid coating, and it may further include repeating the steps of applying the liquid precursor and drying the liquid coating one or more times until the thin film of dielectric metal oxide has a desired thickness. The liquid precursor may comprise a metal carboxylate, a metal alkoxide, or a metal alkoxycarboxylate.

In an embodiment of the invention, the method preferably further comprises a step of forming a diffusion barrier layer on the substrate. Typically, the diffusion barrier layer comprises $Si_3N_4$, and the $Si_3N_4$ layer typically has a thickness of about 150 nm. The invention most preferably further includes a step of forming a stress reduction layer between the steps of forming a diffusion barrier layer and forming a bottom electrode. Typically, the stress reduction layer is silicon dioxide. The silicon dioxide layer typically has a thickness of about 100 nm.

Preferably, a relatively low temperature spin-on process as described in copending and co-owned U.S. patent application Ser. No. 08/165,082, incorporated herein by reference, is used to deposit the metal oxide.

The use of a liquid precursor spin-on process to deposit the metal oxide permits much more accurate control of the stoichiometry of the metal oxide and also results in a much more homogeneous material than achieved with other methods. This homogeneity and careful control of the drying and annealing processes leads to electronic properties which are much better than in thin film devices fabricated by prior art methods. Further, the homogeneity of the metal oxides significantly reduces the stresses and cracking that accompanied prior art fabrication methods.

Numerous other features, objects and advantages of the invention will become apparent from the following description when read in conjunction with the accompanying drawings.

DETAILED DESCRIPTION OF THE PREFERRED EMBODIMENT

Figure 1:
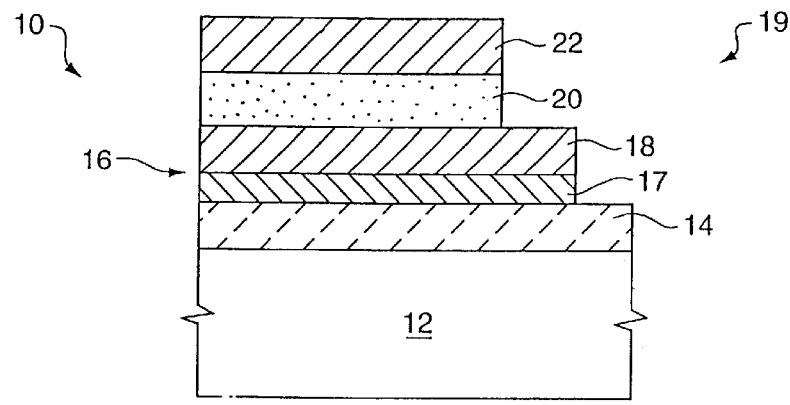
FIG. 1 is a cross-sectional view of an integrated circuit capacitor according to the invention.
Figure 2:
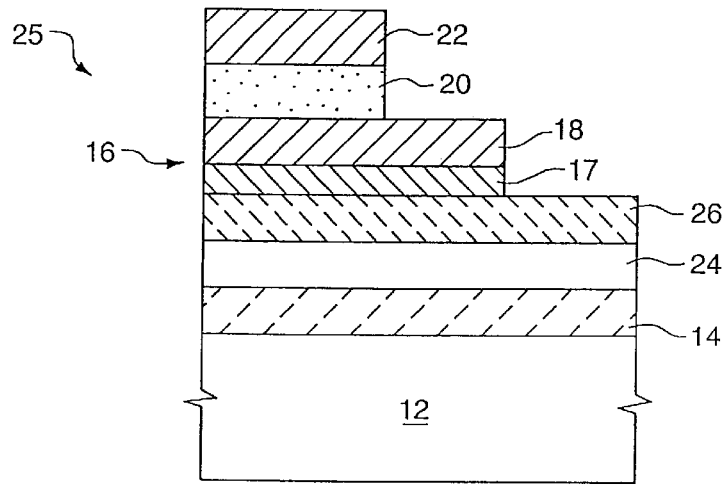
FIG. 2 is a cross-sectional view of an alternative embodiment of an integrated circuit capacitor according to the invention.
Figure 3:
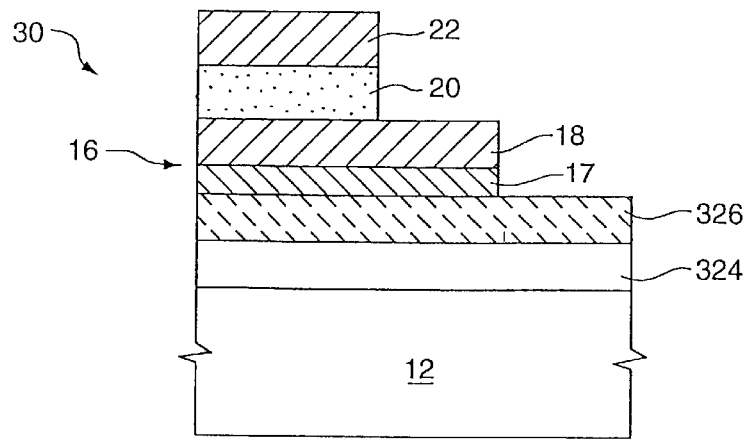
FIG. 3 is a cross-sectional view of an alternative embodiment of an integrated circuit capacitor according to the invention.

It should be understood that FIGS. 1–4 depicting portions of integrated circuits are not meant to be actual cross-sectional views of any particular portion of an actual electronic device, but are merely idealized representations employed to more clearly and fully depict the structure and method of the invention than would otherwise be possible. For example, the relative thicknesses of the Individual layers are not shown proportionately, since otherwise, some layers, such as substrate 12 would be so thick as to make the drawing unwieldy. It should also be understood that capacitors 10, 25, 30, 402 form portions of Integrated circuits that include other electronic devices, such as transistors, other capacitors, etc. In addition, dielectric metal oxide thin film 20, 420 may be incorporated into other devices, such as ferroelectric FETs, as well as capacitors. For the sake of clarity, elements common to the devices depicted in FIGS. 1–3 are indicated with the same reference numerals.

In FIG. 1 is shown a thin film capacitor 10 in accordance with the preferred embodiment of the invention. Capacitor 10 is formed on silicon germanium substrate ("SiGe substrate") 12, which is covered by a field oxide layer 14. Capacitor 10 includes bottom electrode 16, comprising adhesion layer 17 and electrode layer 18. Preferably, electrode layer 18 comprises platinum of 200 nm thickness, and adhesion layer 17 comprises a thin film of titanium having a thickness of about 20 nm. Capacitor 10 also includes dielectric metal oxide thin film 20, such as BST, and top electrode 22, also preferably about 200 nm thick and made of platinum.

Herein, "substrate" may be used to refer to the SiGe substrate 12, but more generally will refer to any support for another layer. For example, substrate 19 for dielectric metal oxide thin film 20 of capacitor 10 is, immediately, platinum electrode layer 18, but also can be interpreted broadly to include layers 18, 17, 14, and 12, as well.

In this disclosure, the term "SiGe substrate" is defined as any semiconductor substrate containing a silicon germanium region. A silicon germanium region comprises crystal lattices in which Ge-atoms substitute for Si-atoms. The SiGe substrate may be a SiGe wafer 12, as in FIGS. 1–3, in which case the vast majority of the wafer is a silicon germanium region; or, as in FIG. 4, the SiGe substrate may be a conventional silicon semiconductor wafer 406 containing a distinct silicon germanium region 408. In a silicon germanium region, the mole ratio of silicon to germanium may be constant or it may vary spatially. The mole ratio of silicon to germanium may be expressed by the stoichiometric formula $Si_{1-x}Ge_x$, in which $0<x<1$. Typically, $0.05<x<0.5$; preferably, x is about 0.3. The mixed SiGe crystalline material in the silicon germanium region may also contain other types of atoms besides Si or Ge. For example, it is often doped with up to about 3 mole-percent carbon to reduce strain.

In this disclosure, the term "high capacitance" means a device in which the capacitor material has a dielectric constant of 15 or higher.

Terms of orientation, such as "above", "top", "upper", "below", "bottom" and "lower" herein, mean relative to SiGe substrate 12, 406. That is, if a second element is "above" a first element, it means it is farther from SiGe substrate 12, 406; and if it is "below" another element, then it is closer to SiGe substrate 12, 406 than the other element. The long dimension of SiGe substrate 12, 406 defines a plane that is considered to be a "horizontal" plane herein, and directions perpendicular to this plane are considered to be "vertical". The terms "over" and "directly over" are used synonymously when at least a portion of a particular layer is vertically straight above at least a portion of another layer. For example, in FIG. 1, top electrode 22 is directly over dielectric metal oxide thin film 20. The terms "over" and "directly over" do not mean that the particular layer is in direct contact with an underlying layer. For example, dielectric metal oxide thin film 20 typically does not contact the top surface of SiGe substrate 12, but it is above it. The term "on" is often used in the specification when referring to the deposition or formation of an integrated circuit layer onto an underlying substrate or layer. In contrast to "over" and "directly over", the terms "on" and "onto" generally signify direct contact, as is clear in the various contexts in which they are used.

The term "metal oxide" herein means a material of the general form $A_aB_bO_o$ or $A_aS_sB_bO_o$, where A, B and S are cations, and O is the anion oxygen. The term is intended to include materials where A and B represent multiple elements; for example, includes materials of the form $A'A''BO_3$, $AB'B''O_3$, and $A'A''B'B''O_3$, where A', A", B' and B" are different metal elements. Preferably, A, A', A", are metals selected from the group of metals consisting of Ba, Bi, Sr, Pb, Ca, and La; and B, B', and B" are metals selected from the group consisting of Ti, Zr, Ta, Mo, W, and Nb. The S-site element in the formula usually represents the element bismuth, Bi, but can also be materials such as yttrium, scandium, lanthanum, antimony, chromium and thallium. As an example, the relative amounts of different elements may be expressed as in a formula $(A_{1-x}A'_x)BO_3$, indicating that the total of A-site atoms equals one (1−x+x=1) combined with one B-site atom and three oxygen atoms. Therefore, although the total of A-site and B-site atoms is fixed by the stoichiometrical formula, the relative amounts of A and A' atoms are expressed by "1−x" and "x", respectively. Typically, the metal oxide is a perovskite compound or a layered superlattice material. Many of these metal oxides are ferroelectrics, though some that are classed as ferroelectrics may not exhibit ferroelectricity at room temperature. Ferroelectric compounds have dielectric properties, so both ferroelectric and nonferroelectric, dielectric materials are often referred to as "dielectric" metal oxide materials in this disclosure. Since many ferroelectrics have relatively high dielectric constants, these materials, in a non-ferroelectric phase, are often useful in high dielectric constant capacitors. It is important that the material be in a non-ferroelectric phase because otherwise the ferroelectric switching will interfere with the operation of a circuit designed to operate based on linear capacitance. Preferably, the metal oxide is non-ferroelectric barium strontium titanate (BST) and preferably has the formula $Ba_{0.7}Sr_{0.3}TiO$. The BST may be doped as described in U.S. Pat. No. 5,614,018 issued Mar. 25, 1997 to Azuma et al., which is hereby incorporated by reference as if fully contained herein.

Many other materials may be used for any of the layers discussed above; for example, adhesion layer 17 may comprise tantalum, nickel, tantalum silicide, titanium silicide, nickel silicide, palladium and other materials, as well as titanium; and layer 18 may be other materials, as well as platinum. Electrode 16 may also be formed of less than or more than two layers, and electrode 22 may be formed of more than one layer.

In FIG. 2 is shown an alternative embodiment of the invention, in which a diffusion barrier layer 24 is located on field oxide layer 14 between SiGe substrate 12 and thin film capacitor 25. Diffusion barrier layer 24 encapsulates SiGe substrate 12 to inhibit diffusion of chemical species from SiGe substrate 12 into other parts of the integrated circuit, especially into dielectric metal oxide thin film 20. At the same time, diffusion barrier layer 24 may serve to inhibit undesired diffusion of chemical species from other parts of the integrated circuit into SiGe substrate 12. Preferably, diffusion barrier layer 24 comprises silicon nitride ("$Si_3N_4$"). As depicted in FIG. 2, diffusion barrier layer 24 may optionally be covered by a stress reduction layer 26, typically comprising silicon oxide or some glasseous oxide.

In FIG. 3 is shown another alternative embodiment of the invention in which a diffusion barrier layer 324 is located directly on SiGe substrate 12, between the substrate and thin film capacitor 30, with a stress reduction layer 326 formed on diffusion barrier layer 324.

Figure 4:
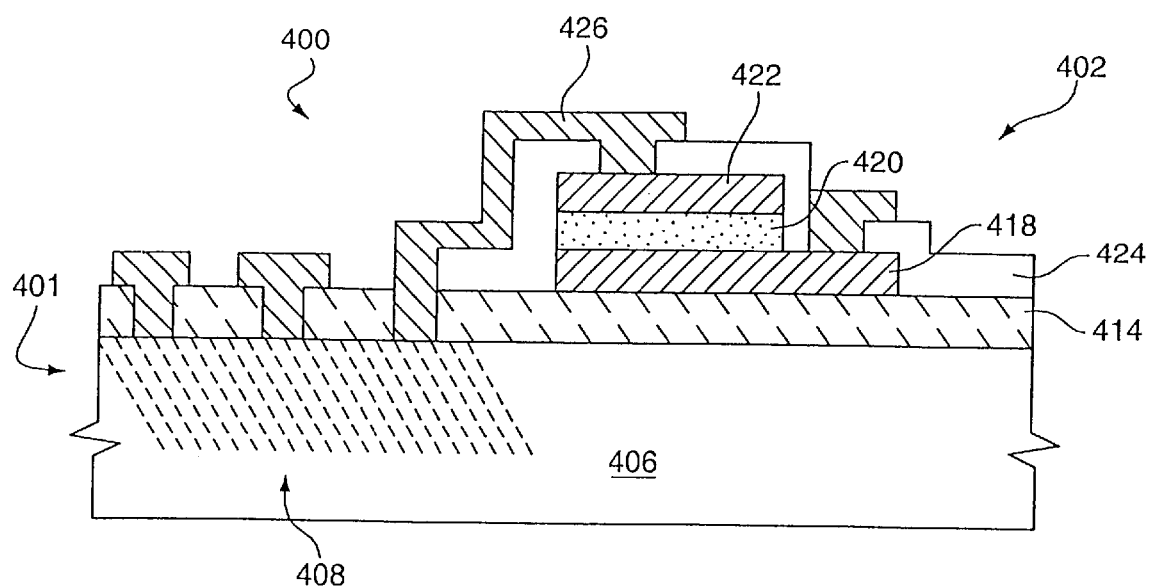
FIG. 4 is a diagrammatic representation of a section of an integrated circuit in which a thin film capacitor according to the invention is in electrical connection with a silicon germanium device portion containing a silicon germanium device.

FIG. 4 is a diagrammatic representation of a section 400 of an integrated circuit in which a thin film capacitor 402 according to the invention is in electrical connection with silicon germanium device portion 408 containing a silicon germanium device. Semiconductor wafer 401 comprises SiGe substrate 406. Semiconductor wafer 401 may be a silicon germanium wafer, or it may be a conventional silicon wafer having a distinct silicon germanium region. The silicon germanium region may be a germanium-doped region or a SiGe epitaxial layer. Silicon germanium device portion 408 is preferably located in and/or on SiGe substrate 406. The silicon germanium device portion may include devices typically one selected from the group including a BiCMOS device, a HBT device and a MOSFET device. Thin film capacitor 402 comprises bottom electrode 418, thin film 420 of dielectric metal oxide and top electrode 422. Diffusion barrier layer 414 separates thin film capacitor 402 from SiGe substrate 406. Thin film capacitor 402 is typically covered by ILD 424. Thin film capacitor 402 is electrically connected to silicon germanium device portion 408 by local interconnect ("LI") 426. Local interconnect 426 typically is part of the first level wiring of the integrated circuit 400 and may be made of aluminum or other suitable conductive material.

Figure 5:
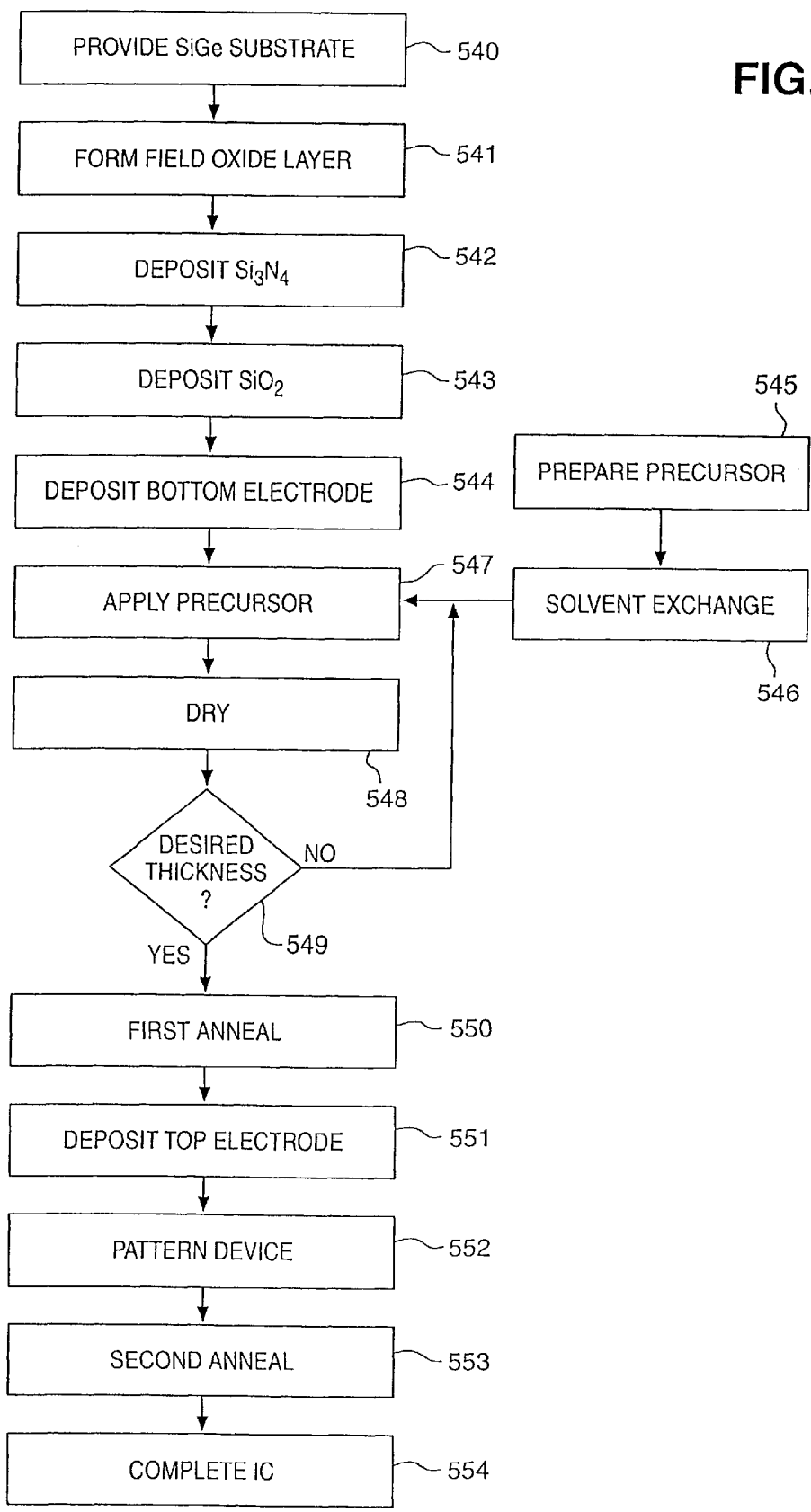
FIG. 5 is a flow chart of an exemplary process according to the invention for fabricating a thin-film capacitor.

A flow chart of a generalized process 500 for fabricating capacitor 10 according to the preferred embodiment of the method of the invention is shown in FIG. 5. The process shall be discussed in terms of the embodiments of FIGS. 1–2, but could just as well be discussed in terms of the other embodiments. In step 540, a SiGe substrate 12 is provided. This substrate 12 is preferably made using conventional methods of forming a SiGe region in a silicon semiconductor substrate. In step 541, a field oxide region 14 is formed using conventional processes, preferably by thermal oxidation, but optionally by a sputtering or a spin-on method. In step 542, an optional diffusion barrier layer 24 of silicon nitride about 150 nm thick is deposited, preferably by plasma enhanced chemical vapor deposition ("PECVD"), although other methods may also be used. If a diffusion barrier is present, then optionally a stress reduction layer 26, preferably of silicon dioxide about 100 nm thick, is deposited in step 543, by any conventional method, such as PECVD or wet growth. In step 544, a bottom electrode 16 is deposited. Preferably, bottom electrode 16 comprises an adhesion layer 17, preferably of titanium and about 20 nm thick, and electrode layer 18 of platinum about 200 nm thick, both deposited preferably by sputtering. A liquid precursor for the dielectric metal oxide material contained in thin film 20 is prepared in step 545; this may be just prior to application step 547, but usually a stock solution is prepared and stored well prior to the application. The liquid precursor preferably contains metal organic precursor compounds suitable for forming barium strontium titanate, and the precursor is prepared as described in U.S. Pat. No. 5,514, 822, issued May 7, 1996 to Scott et al., which is hereby incorporated by reference as if fully contained herein. The aforenamed patent discloses a method of making a metal oxide which utilizes the combination of a metal alkoxycarboxylate, such as barium alkoxycarboxylate, and a metal alkoxide, such as titanium isopropoxide. Specifically, a BST precursor is made by reacting barium with 2-methoxyethanol and 2-ethylhexanoic acid, adding strontium, allowing the mixture to cool, adding Utanium isopropoxide and 2-methoxyethanol, and heating to obtain a final BST concentration of about 0.5 moles/liter. If a dopant is to be added, a dopant precursor solution is prepared and added to the precursor in step 545. Just prior to the application step, a solvent exchange step 546 is preferably performed. That is, a stock solution prepared as above is removed from storage, and the solvent that is convenient for manufacturing and/or which makes a precursor that stores well, such as xylene, is exchanged for a solvent that has a good viscosity for the application process, such as n-butyl acetate for a spinning application process. The exchange is performed by adding the new solvent and distilling out the old. Preferably, for a spin-on process, the concentration of the spin-on precursor solution is 0.29–0.31 moles/liter, which is controlled in solvent exchange step 546. In step 547, the precursor is applied to substrate 19 to form a liquid coating, preferably by spinning at 1500 RPM to 2000 RPM for 20 seconds to 60 seconds. However, other application methods may be used to form a liquid coating on the substrate; for example, a misted deposition process as described in U.S. Pat. No. 5,456,945, issued Oct. 10, 1995 to McMillan et al., which is hereby incorporated by reference as if fully contained herein. In steps 548 and 550, the liquid coating of precursor is treated to form a dielectric metal oxide thin film layer on substrate 19. The treating is preferably by drying and annealing. The drying is preferably in air or dry nitrogen, and preferably at a relatively high temperature as compared to the prior art, i.e., at from 200° C. to 500° C. Typically, it is performed at 400° C. for two minutes in air. This high temperature drying step has been found to be essential to obtain predictable properties in BST. After drying, if the dielectric metal oxide layer is not of the desired thickness, application and drying steps 547 and 548 are repeated until the desired thickness is reached. Usually one to two repetitions of steps 547 and 548 are required to reach the thickness of about 200 nm. When the desired thickness is obtained, the dried coating of precursor is annealed in step 550 to form the dielectric metal oxide thin film layer 20. The annealing is referred to as the "first anneal" to distinguish it from a later, second anneal. The first anneal is preferably performed in oxygen at a temperature of from 600° C. to 850° C. for from 1 minute to 90 minutes. Typically, it is performed at 700° C. for 60 minutes in $O_2$ in a push/pull process including 10 minutes for the "push" into the furnace and 10 minutes for the "pull" out of the furnace. Careful control of this anneal temperature and time is also essential for predicable results. The resulting dielectric metal oxide thin film layer has a thickness In the range of from 20 to 500 nm, preferably about 200 nm. The layer is patterned and etched to form dielectric metal oxide thin film 20. In step 551, a top electrode layer is deposited, preferably by sputtering, and preferably about 200 nm thick platinum.

The device is then patterned in step 552 to form top electrode 22. The patterning may comprise only the patterning of the top electrode if any patterning was done after deposition of the bottom electrode. It is important that the device be patterned before second anneal step 553 so that patterning stresses are removed by the anneal and any oxide defects created by the patterning are corrected. Second anneal 553 is preferably performed at the same temperature as the bottom anneal, although variance within a small temperature range of 50° C. to 100° C. about the bottom anneal temperature is possible. The time for the second anneal is preferably less than for the bottom anneal, generally being about 30 minutes, although a range of times from about 1 minute to 90 minutes is possible, depending on the sample. Careful control of the anneal parameters is important to obtain predictable results. In some instances, it is desirable to skip the second anneal altogether. Finally, in step 554, the integrated circuit (IC) is completed to include the capacitor device as an active electronic component in the integrated circuit. Here, "active" means that it is a component in which the electrical parameters change during operation of the circuit, as compared to a passive component, such as passivation layer, the electronic parameters of which do not change during operation of the integrated circuit. The completion steps typically include an ILD deposition and planarization, etching of via contacts, second level metal deposition and etching and deposition of passivation layers and opening of bonding pads.

Placing the capacitor structure on a SiGe substrate retains the high frequency performance of the structures described in U.S. Pat. No. 5,473,171, which is hereby incorporated by reference as though fully disclosed herein. At the same time, certain problems that can occur with gallium arsenide substrates are eliminated, such as possible diffusion of constituent atoms from gallium arsenide substrates at fabrication temperatures exceeding 350° C. and the difficulty of depositing oxides on gallium arsenide. Because of the elimination of these problem areas, adequate high frequency performance can be obtained without the use of the barrier layer, the stress reduction layer, or both. Further, the use of the SiGe substrate may enhance the adhesion of the barrier and stress layers when these layers are used.

There has been described novel structures and processes for fabricating integrated circuits having high-capacitance, high-frequency thin film capacitors. It should be understood that the particular embodiments shown in the drawings and described within this specification are for purposes of example and should not be construed to limit the Invention. Further, It is evident that those skilled in the art may now make numerous uses and modifications of the specific embodiment described, without departing from the inventive concepts. For example, other capacitor structures than those shown in FIGS. 1–4 may be used, and the capacitors and processes of making them may be combined with a wide variety of other structures and processes. Equivalent materials, different material thicknesses, and other methods of depositing the substrate and electrode layers may be used. It is also evident that the process steps recited may in some instances be performed in a different order; or equivalent structures and processes may be substituted for the various structures and processes described.

We claim:

1. A high capacitance thin film capacitor device comprising:

a silicon germanium substrate;

a capacitor, said capacitor comprising a bottom electrode, a top electrode, and a thin film of dielectric metal oxide between said electrodes;

a diffusion barrier layer located directly on said silicon germanium substrate between said substrate and said capacitor; and a stress reduction layer located between said silicon germanium substrate and said bottom electrode.

2. A high capacitance thin film capacitor device as in claim 1 wherein said metal oxide comprises barium strontium titanate.

3. A high capacitance thin film capacitor device as in claim 2 wherein said barium strontium titanate is represented by a chemical formula $(Ba_{1-x}Sr_x)TiO_3$, where $0>x>1$.

4. A high capacitance thin film capacitor device as in claim 3 wherein said barium strontium titanate is represented by a chemical formula $(Ba_{0.7}Sr_{0.3})TiO_3$.

5. A high capacitance thin film capacitor device as in claim 1 wherein said metal oxide comprises a layered superlattice material.

6. A high capacitance thin film capacitor device as in claim 5 wherein said layered superlattice material is ferroelectric.

7. A high capacitance thin film capacitor device as in claim 5 wherein said layered superlattice material is nonferroelectric.

8. A high capacitance thin film capacitor device as in claim 1 wherein said metal oxide comprises a perovskite compound.

9. A high capacitance thin film capacitor device as in claim 8 wherein said perovskite compound is ferroelectric.

10. A high capacitance thin film capacitor device as in claim 8 wherein said perovskite compound is nonferroelectric.

11. A high capacitance thin film capacitor device as in claim 1 wherein said diffusion barrier layer comprises $Si_3N_4$.

12. A high capacitance thin film capacitor device as in claim 1 wherein said stress reduction layer is located between said diffusion barrier layer and said bottom electrode.

13. A high capacitance thin film capacitor device as in claim 12 wherein said stress reduction layer is located directly on said diffusion barrier layer.

14. A high capacitance thin film capacitor device as in claim 12 wherein said stress reduction layer comprises silicon dioxide.

15. A high capacitance thin film capacitor device as in claim 12 wherein said stress reduction layer comprises a glasseous oxide.

16. A high capacitance thin film capacitor device as in claim 1 wherein said bottom electrode comprises an adhesion layer and an electrode layer.

17. A high capacitance thin film capacitor device as in claim 16 wherein said adhesion layer comprises a material selected from the group consisting of titanium, tantalum, nickel, tantalum silicide, nickel silicide, and palladium.

18. A high capacitance thin film capacitor device as in claim 16 wherein said electrode layer comprises platinum.

19. A high capacitance thin film capacitor device as in claim 1 wherein said stress reduction layer comprises silicon dioxide.

20. A high capacitance thin film capacitor device as in claim 1 wherein said stress reduction layer comprises a glasseous oxide.

21. A high capacitance thin film capacitor device as in claim 1 wherein said silicon germanium substrate comprises a silicon germanium wafer.

22. A high capacitance thin film capacitor device as in claim 1 wherein said silicon germanium substrate comprises a silicon semiconductor wafer.

23. A high capacitance thin film capacitor device as in claim 1 wherein said silicon germanium substrate comprises a silicon germanium region.

24. A high capacitance thin film capacitor device as in claim 23 wherein said silicon germanium region comprises a crystal lattice having relative amounts of silicon and germanium atoms represented by a stoichiometric formula $Si_{1-x}Ge_x$, in which $0<x<1$.

25. A high capacitance thin film capacitor device as in claim 23 wherein said silicon germanium region comprises a silicon germanium layer.

26. A high capacitance thin film capacitor device as in claim 1 wherein said silicon germanium substrate comprises a silicon germanium device portion.

\* \* \* \* \*